United States Patent
Hung et al.

(10) Patent No.: US 6,458,705 B1
(45) Date of Patent: Oct. 1, 2002

(54) METHOD FOR FORMING VIA-FIRST DUAL DAMASCENE INTERCONNECT STRUCTURE

(75) Inventors: Kuei-Chun Hung, Hsin-Chu; Vencent Chang, Taipei; I-Hsiung Huang, Kaohsiung; Ya-Hui Chang, Ping-Tung, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/874,522

(22) Filed: Jun. 6, 2001

(51) Int. Cl.$^7$ .............................. H01L 21/00
(52) U.S. Cl. ................ 438/692; 216/38; 216/88; 216/99; 216/100; 438/745; 438/754; 438/756
(58) Field of Search .................. 438/691, 692, 438/693, 745, 753, 754, 756; 216/38, 88, 89, 91, 99, 100

(56) References Cited

U.S. PATENT DOCUMENTS 6,165,891 A * 12/2000 Chooi et al. ............ 438/692 X
6,187,661 B1 * 2/2001 Lou ..................... 438/692 X
6,251,774 B1 * 6/2001 Harada et al. .......... 438/692 X
6,261,960 B1 * 7/2001 Yu et al. ................... 438/692

* cited by examiner

Primary Examiner—William A. Powell
(74) Attorney, Agent, or Firm—Powell Goldstein Frazer & Murphy LLP (57) ABSTRACT

In accordance with the present invention, a method for forming a via-first dual damascene interconnect structure by using gap-filling material whose thickness is easily controlled by a developer is provided. The essential part of the present invention is the application of gap-filling materials such as novolak, PHS, acrylate, methacrylate, and COMA to fill vias. Filling vias with these materials can get a greater planar topography for trench patterning due to its excellent gap-filling capacity, protect the bottom of vias from damage during the trench etch, and prevent the fence problem by using a developer to control its thickness in vias.

20 Claims, 6 Drawing Sheets

METHOD FOR FORMING VIA-FIRST DUAL DAMASCENE INTERCONNECT STRUCTURE

BACKGROUND OF THE INVENTION

1. Field of the Invention

The present invention generally relates to a method for forming multi-level interconnect in an integrated circuit, and more particularly to a method for forming a via-first dual damascene interconnect structure by using gap-filling materials whose thickness is controlled by a developer.

2. Description of the Prior Art

As feature sizes shrink, more devices can be built per unit substrate area. The multi-layer interconnects are employed in order to accommodate higher densities as device dimensions shrink well below one micron design rules. Through advanced semiconductor processing techniques, integrated circuit devices with sub-micron and sub-half-micron features have driven the need for multi-layer interconnects. At the same time, the size of interconnect structures will also need to shrink, in order to accommodate the smaller dimensions. Thus, as integrated circuit technology advances into the deep sub-micron range, more advanced interconnect architecture and application are required.

Damascene integration scheme is one such architecture to satisfy this need. The main advantage of the damascene process is the elimination of the need to etch the metal layer that provides the interconnections. Another advantage is that it can eliminate the need for a dielectric gap fill. A third advantage is that it avoids some of the problems associated with lithographic overlay tolerance, making it possible to achieve higher interconnect packing density. There are two major classes of damascene processes: single-damascene and dual-damascene. A single damascene process involves making contact to a lower conductive layer by patterning dielectric layer and forming a conducting plug in the dielectric layer, then patterning a second dielectric layer and forming the actual interconnect wiring metallization in the dielectric layer. The dual damascene technology is applied, as integrated circuit technology advances to 0.18 micrometer. In a dual damascene process, the interconnect wiring and plug are formed by patterning both the via and the trench patterns into dielectric layer, then filling them simultaneously with conducting material, such as metal. The dual damascene process offers an advantage in process simplification and low manufacturing cost by reducing the process steps required to form the vias and trenches for a given metallization level. The openings, for the wiring of a metallization level and the underlying via connecting the wiring to a lower conducting level, are formed at the same time.

Dual damascene integration requires challenging developments of patterning processes. Both lithography and etch become more difficult due to complex layer stack and intermediate topography. Therefore, many different dual damascene patterning strategies are possible, leading to a similar topography before the conducting material is placed. Many dual damascene process flows depend upon the sequence of basic etch steps, which defines a dual damascene process flow as self-aligned, trench-first, or via-first. Self-aligned dual damascene (SADD) needs a thick intermediate layer to serve as a photo anti-reflection layer, an etch-stop layer, and a hard mask providing CD control for underlying vias. Because self-aligned vias require almost perfect trench-to-via alignment and the challenge of maintaining a very high selectivity between the dielectric and intermediate stop layer when etching the via, its application is limited. In the approach of trench-first dual damascene (TFDD), the trench is masked and etched through the dielectric with stop at a timed depth. The via pattern is then aligned with trench and etched through the dielectric to the lower conductive layer. Achieving a very uniform trench with a smooth flat etch front and maintaining via critical dimension control are the specific etch challenges assorted with trench-first flow. In the via-first dual damascene (VFDD), the via lithography is done first on top of the full stack. After via-etch and strip, the trench photo step is done. In some cases, the bottom of via is covered by a gap-filling material, such as an organic anti-reflective coating, to protect via during the trench etch.

Figure 1:
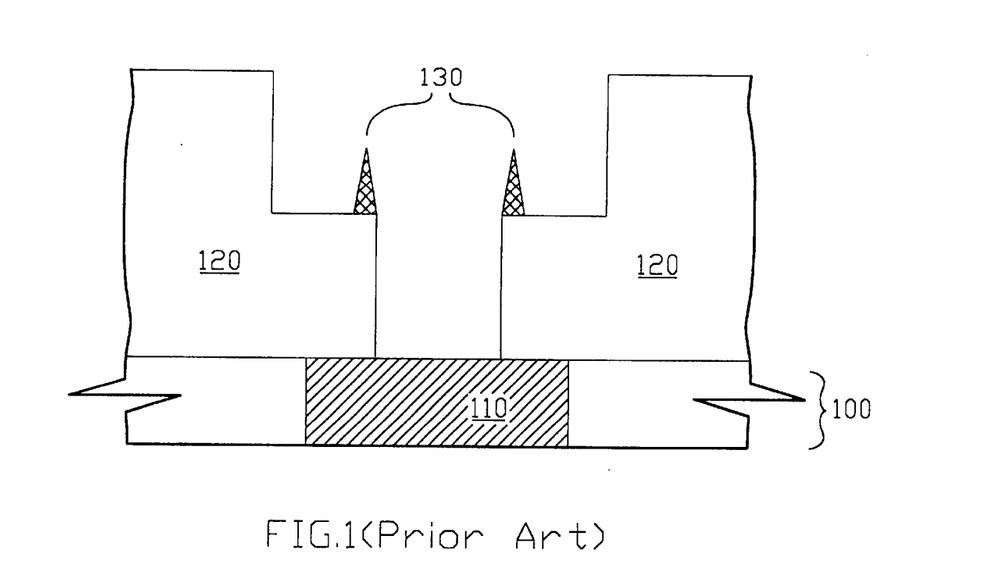
FIG. 1 is a schematic cross-sectional view of fence problem occurred in forming a dual damascene structure by the prior art technique.

It is well known that reflection control is essential in lithography processing. Unwanted reflections from these underlying materials during the photoresist patterning process cause the resulting photoresist pattern to be distorted. The use of a bottom-anti-reflective coating (BARC) is pursued in the integration of dual damascene not only to prevent distortion of photoresist pattern but also to act as the gap-filling material. However, by use of BARC as the gap-filling material in the VFDD process, several concerned problems are occurred. While a BARC is in contact with low k dielectric layer in via, a chemical interaction takes place within the via forming a thin residue which induces an incomplete trench etch with the fence problem. As shown in FIG. 1, a low k dielectric layer 120 is formed on a substrate 100 having a conductive structure 110, and the fence problem 130 is appeared when using BARC as the gap-filling material. Moreover, when a gap-filling material containing nitrogen atom is in contact with a low k dielectric layer, the value of k will increase due to the diffusion of nitrogen atom. After creating via openings, local reflectivity changes occur over the substrate. This is not only the result of local reflectivity variations, but also of the severe resist thickness variations, due to changes in feature topography density. A possible solution is the use of an organic BARC, which helps on one hand to make the reflectivity again more uniform, but on the other hand to decrease the step height on the surface.

Figure 2:
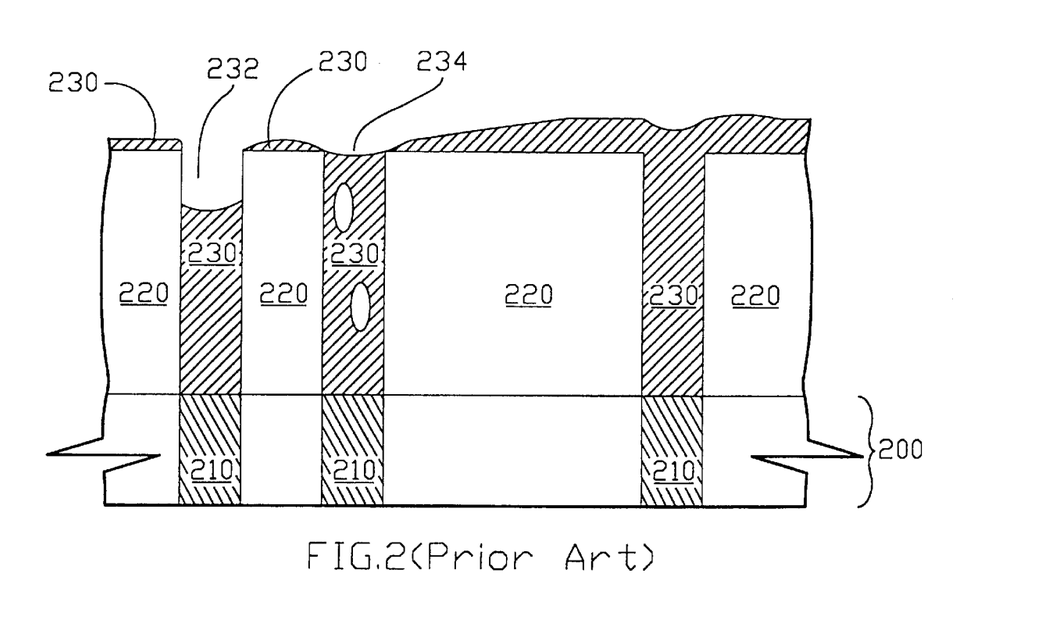
FIG. 2 is a schematic cross-sectional view of BARC level in isolated/dense area after the gap filling process in accordance with the prior art technique.

However, in the VFDD process, using BARC as the gap-filling material results in trench profile distortion due to the rough topography, which suffers lithography process window. In conventional techniques using BARC filling vias, it is difficult to fill both isolated and dense vias in a similar way. The BARC coating level is very different depending very much on the feature density and size. Referring to FIG. 2, which shows a dielectric layer 220 is formed on a substrate 200 having conductive structures 210 by using BARC 230 as the gap-filling material. For some cases, the via 232 is not fully filled, void occurs inside the covered via 234, or a rough topography is presented. In order to avoid the formation of fences during the trench etching, controlling the gap-filling material thickness is very important. Special care for controlling the BARC thickness to prevent the fence problem is developed by complex etching process in the prior art. However, it is highly desirable to use a gap-filling material which easily fills gaps, is free of nitrogen atom and easy for its thickness control, in that it exhibits excellent planarity, gap-filling capacity, and fence-free structure in the dual damascene process.

SUMMARY OF THE INVENTION

The present invention is directed to a method for forming via-first dual damascene interconnect structure by using gap-filling materials whose thickness is easily controlled by a developer to prevent fence problem. The gap-filling materials include novolak, PHS (poly hydroxy styrene), acrylate, methacrylate, and COMA (cyclo alicylic co-polymer with maleic anhydride). The advantage of using novolak as the gap-filling material is to get a fine planar topography for larger process window due to its excellent gap-filling capacity. Another advantage is that novolak free of nitrogen atom is good for low k material application in the dual damascene process. A third advantage is that novolak is easily dissolved in a developer, such as 2.38% TMAH (tetramethylammonium hydroxide) solution, and the thickness of novolak in via can be easily controlled by fine-tuning the removal time to prevent the fence problem from forming.

It is another object of this invention that a method for protecting the bottom of via by using gap-filling material is provided.

It is a further object of the present invention that a method for eliminating the need to etch gap-filling material thickness in via is provided.

In accordance with the present invention, in one embodiment, a method for forming a via-first dual damascene interconnect structure is disclosed by using novolak as the gap-filling material is disclosed. The method comprises the step of providing a substrate having a conductive structure. Then, a dielectric layer is formed on the substrate. A first patterned photoresist is then formed on the dielectric layer, wherein the first patterned photoresist defines a via opening. Next, the dielectric layer is etched to expose the conductive structure of the substrate by using the first patterned photoresist as a mask. Then, the first patterned photoresist is removed. The key aspect of the present invention is that a novolak layer is formed on the dielectric layer and fills the via. Then, the novolak layer is chemical mechanical polished to expose the dielectric layer. A BARC layer is formed on the dielectric layer. Then, a second patterned photoresist is formed on the BARC layer, wherein the second patterned photoresist defines a trench opening, and the BARC layer is etched to form the trench pattern. Then, a portion of the novolak layer is time-removed by a developer to a depth about the desired trench opening level, which is about half thickness of the dielectric layer. Then, an upper portion of the dielectric layer is etched to form the trench opening in the dielectric layer. The second patterned photoresist, the BARC layer, and the novolak layer are removed. Then, the first opening and the second opening are filled with a conductive material to form a conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Figure 3A:
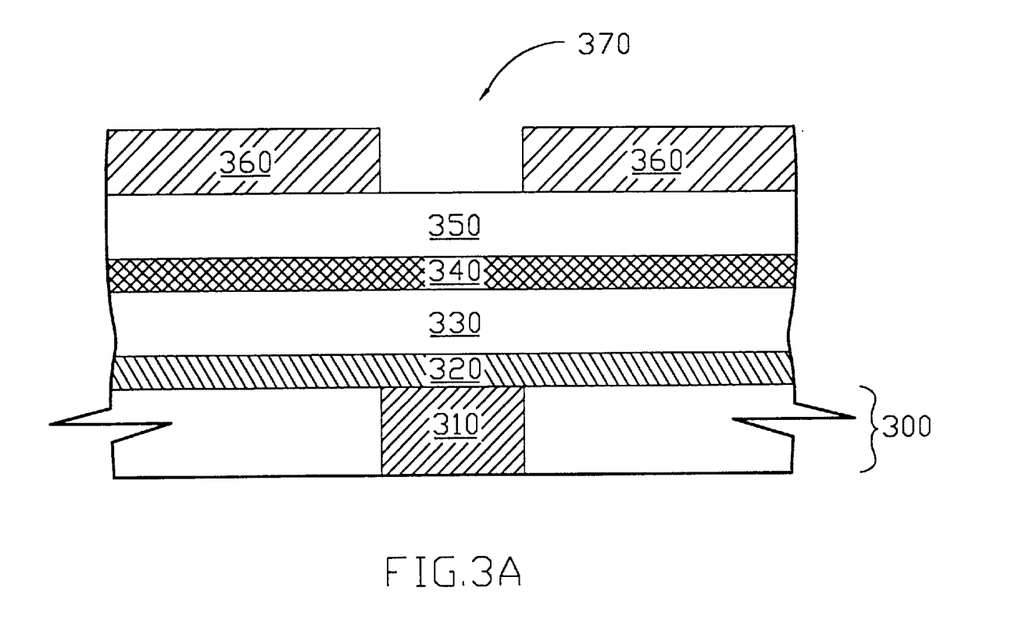
FIGS. 3A to 3I is a schematic cross-sectional view of forming via-first dual damascene structure with etch-stop layer and cap layer in accordance with the present invention.

In accordance with the present invention, a method for forming a via-first dual damascene interconnect structure is disclosed. The essential part of the present invention is the application of gap-filling materials, such as novolak, PHS, acrylate, methacrylate, and COMA, to create a greater planar topography for trench patterning, to protect the bottom of via from damage during the trench etch, and to prevent fence problem. Referring to FIG. 3A, the method comprises a step of providing a substrate 300 having a conductive structure 310. The substrate 300 includes any suitable semiconductor material at any stage of device processes needs an interconnection. The conductive structure 310 is any structure to which an electrical contact is desired, such as a metal line. Then, an optional cap layer 320, such as a silicon nitride layer, is formed on the substrate 300 to serve the purpose of preventing diffusion of metal into overlying structures. Next, a first dielectric layer 330 and a second dielectric layer 350 are formed with an optional intervening etch-stop layer 340. Both dielectric layers may be formed from low k materials but not limited. If there is no the intervening etch-stop layer, only one dielectric layer formed on the substrate 300 is also sufficient to serve the purpose of forming a dual damascene structure. The etch-stop layer 340 with high selectivity to the etchant used in etching the dielectric layers which serves the purpose of trench etch-stop layer can be a silicon nitride layer.

Figure 3B:
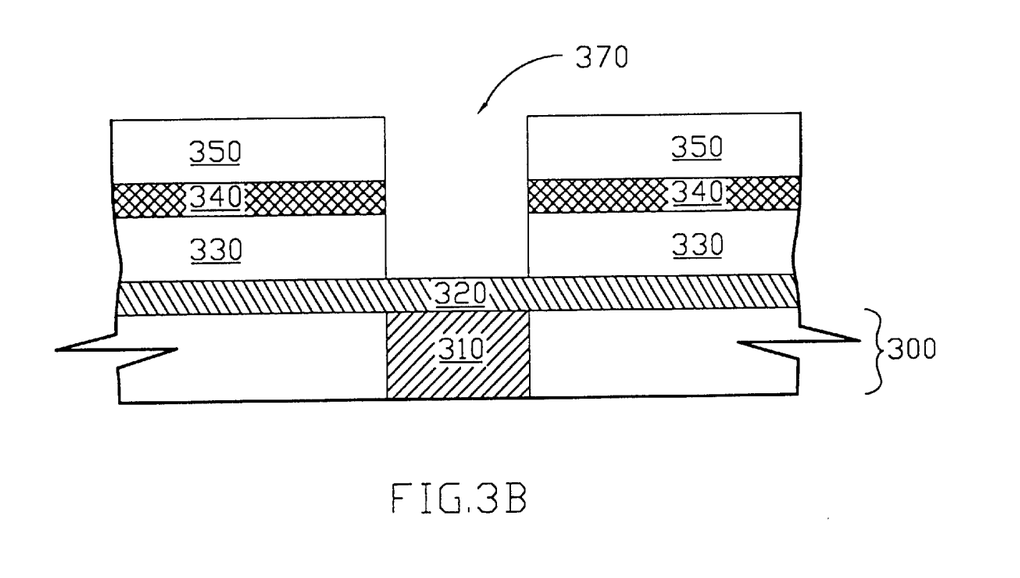
Figure 3C:
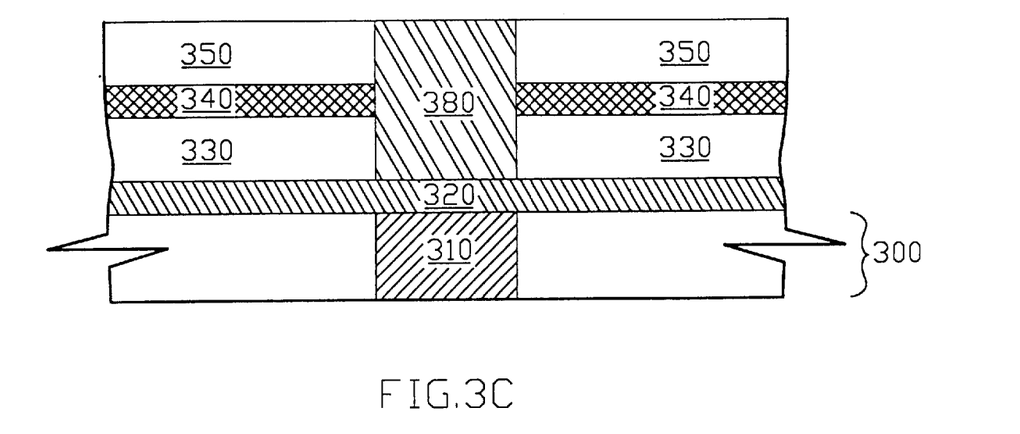
Figure 3D:
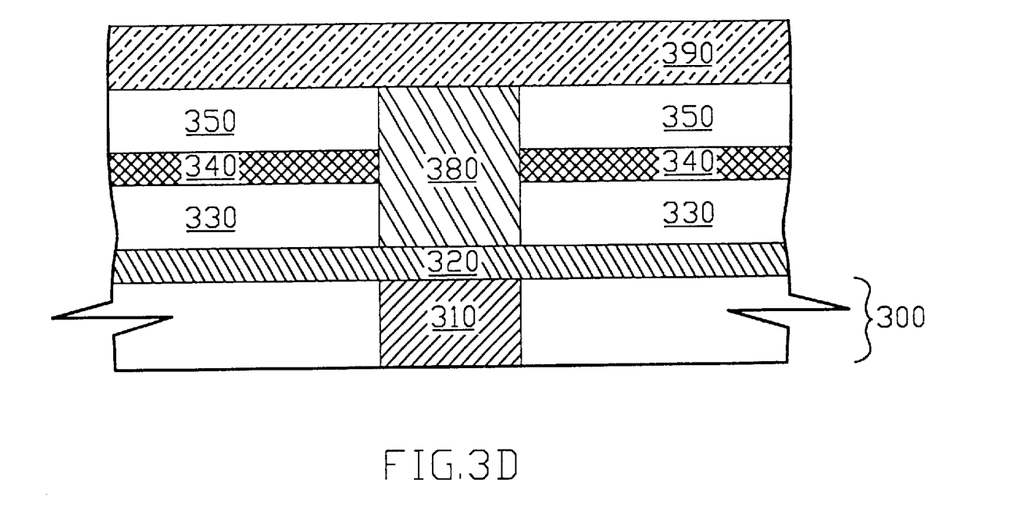
Figure 3E:
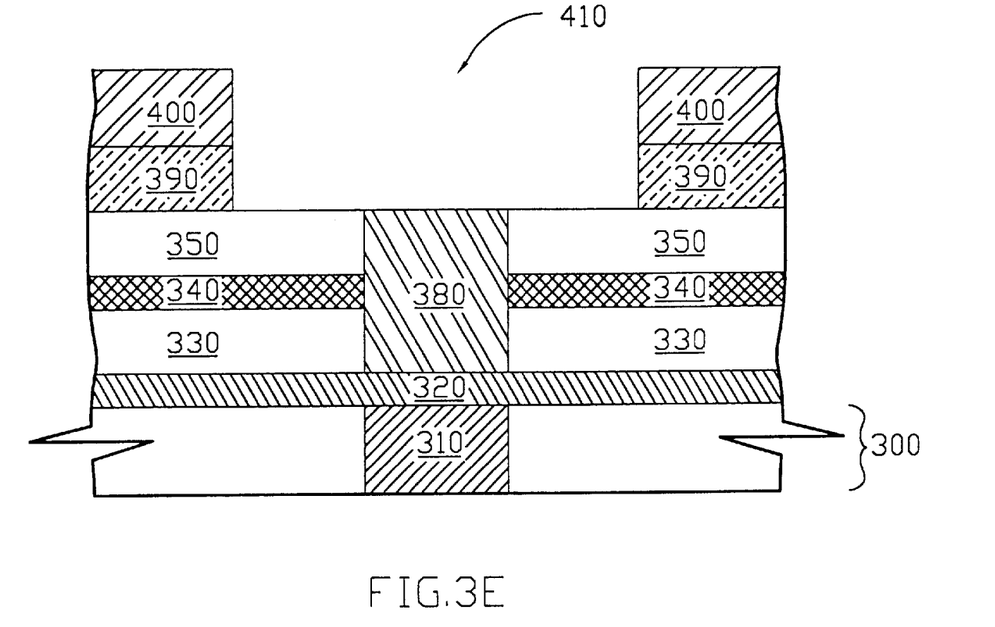

Then, a first patterned photoresist 360 is formed on the second dielectric layer 350, wherein the first patterned photoresist 360 defines a first opening 370. The first opening is a via opening. Then, the second dielectric layer 350, the etch-stop layer 340, and the first dielectric layer 330 are etched to expose the cap layer 320 by using the first patterned photoresist 360 as a mask. If there is no cap layer 320, the purpose of the etching process is to expose the conductive structure 310 of the substrate 300. After the via opening 370 is formed, the first patterned photoresist 360 is removed, as shown in FIG. 3B. At the next step, and as a key aspect of the present invention, by using gap-filling materials such as novolak, a novolak layer 380 is formed on the second dielectric layer 350 and the via opening 370 is filled. Then, the novolak layer 380 is planarizied by chemical mechanical polishing to the level equal to that of the second dielectric layer 350, as shown in FIG. 3C. The polishing process not only planarizes the novolak layer 380 but also prevent profile distortion from a developer later used. Next, a BARC layer 390 is formed on the second dielectric layer 350 with novolak filled via 380, as shown in FIG. 3D. The BARC layer 390 not only serves as an anti-reflective layer but also protects the novolak from intermixing with deep UV photoresist later used and from cross-linking by deep UV light exposure. Then, a second patterned photoresist 400 is formed on the BARC layer 390. The second patterned photoresist 400 defines a trench opening 410. The BARC layer 390 is etched to expose the second dielectric layer 350 by using the second patterned photoresist 400 as a mask, as shown in FIG. 3E.

Figure 3F:
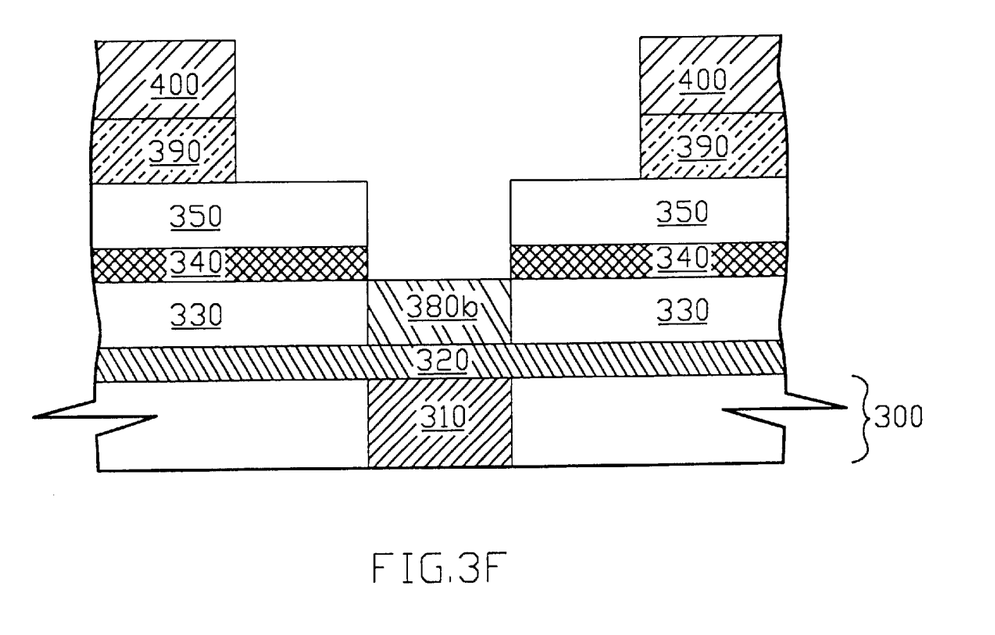
Figure 3G:
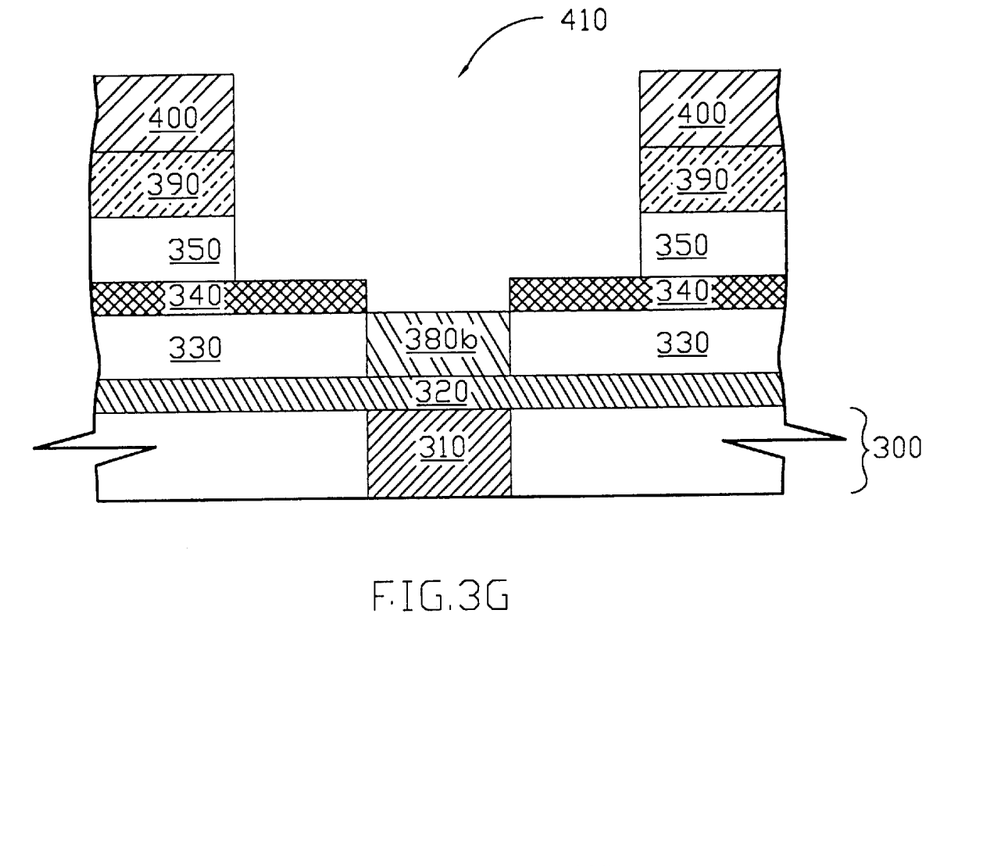

In one embodiment, the novolak layer 380 is then removed from the areas not covered by the BARC layer 390 until about the level of etch-stop layer 340 is reached, as shown in FIG. 3F. The novolak level is depending on the thickness needed to protect the bottom of via against over trench etch and prevent from fence problem. Because novolak can dissolve in a developer, such as 2.38% TMAH solution, this is easily accomplished by fine-tuning the removal time. Then, the second dielectric layer 350 is etched forming the trench opening 410 until etch-stop layer 340 is reached, as shown in FIG. 3G. Alternately, as another embodiment, instead of removing novolak layer 380 prior to etching the second dielectric layer 350 for forming the trench opening 410, both novolak layer 380 and the second dielectric layer 350 are etched simultaneously to form the same structure as shown in the same FIG. 3G.

Figure 3H:
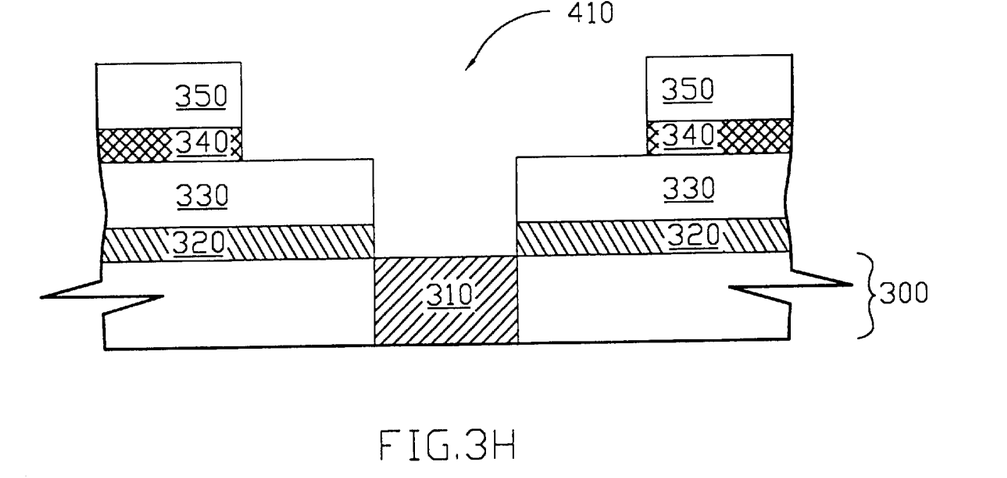

Then, the second patterned photoresist 400, the BARC layer 390, and the remaining novolak layer 380b are removed to expose the conductive structure 310 if there is no cap layer presented. If a cap layer 320 is applied, a further etching step of removing the cap layer 320 is performed to expose the conductive structure 310. It is noted that the remaining novolak layer 380b is removed before the cap layer etching process. Simultaneously, the portion of etch-stop layer 340 exposed in the trench opening can be removed during the cap layer etching. Then, the second patterned photoresist 400 and the BARC layer 390 are removed, as shown in FIG. 3H. The second patterned photoresist 400 can be removed by a conventional technique such as ashing in an oxygen ($O_2$) plasma.

Figure 3I:
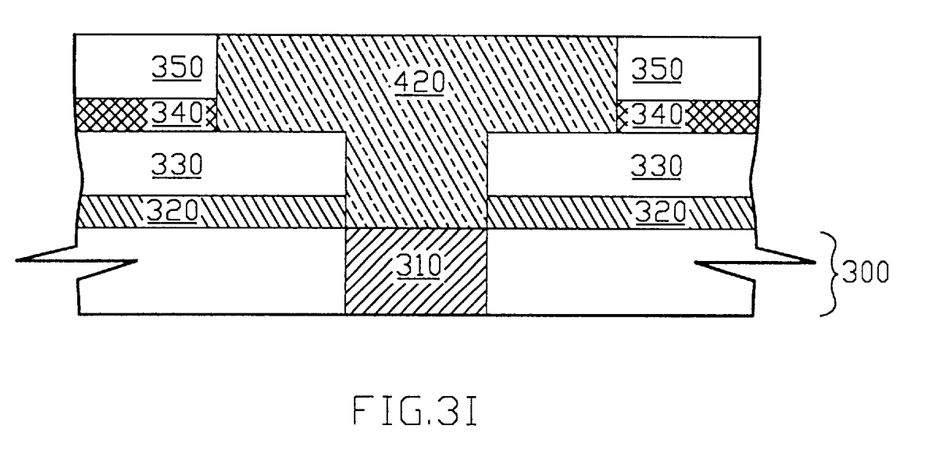

A conductive layer 420 in the dual damascene interconnect structure, such as a metal layer, is then formed on the second dielectric layer 350 and fills the via opening and trench opening with conductive materials, as shown in FIG. 3I. The step of forming the metal layer 420 comprises depositing a metal layer such that the metal layer is electrically continuous with the conductive structure 310 and planarizing the metal layer 420 to expose the second dielectric layer 350. The metal layer can be a deposited copper layer. An optional barrier layer can also be deposited over the substrate to cover the bottom and sidewalls of the openings prior to forming the conductive layer. The barrier layer serves as a diffusion barrier preventing materials from the conductive layer from diffusing into the dielectric layer. The major feature in the embodiment is the application of novolak as a gap-filling material to get finer planar topography for patterning the second pattern on a planar surface to enhance the process window in the following photolithography process. Because novolak is easily dissolved in a developer, and the thickness of novolak in via can be easily controlled by fine-tuning the removal time to prevent the fence problem. Furthermore, novolak free of nitrogen atom is good for low k material application in the dual damascene process.

Although specific embodiments have been illustrated and described, it will be obvious to those skilled in the art that various modifications may be made without departing from what is intended to be limited solely by the appended claims.

What is claimed is:

1. A method for forming via-first dual damascene interconnect structure, said method comprising:

providing a substrate with a conductive structure and a dielectric layer on said substrate, wherein said dielectric layer having a first opening to expose said conductive structure;

filling said first opening with a gap-filling material to form a gap-filling layer on said dielectric layer, wherein said gap-filling material is dissolved in a developer;

planarizing said gap-filling layer to expose said dielectric layer;

forming a bottom-anti-reflective coating layer on said dielectric layer and said gap-filling layer;

forming a patterned photoresist on said bottom-anti-reflective coating layer, wherein said patterned photoresist defines a second opening and said second opening is on said first opening;

etching said bottom-anti-reflective coating layer to expose said dielectric layer by using said patterned photoresist as a mask;

removing a portion of said gap-filling layer to a first depth;

etching said dielectric layer to about said first depth to form said second opening in said dielectric layer by using said patterned photoresist as a mask;

removing said patterned photoresist, said bottom-anti-reflective coating layer, and remaining said gap-filling layer; and filling said first opening and said second opening with a conductive material to form a conductive layer.

2. The method according to claim 1, wherein said dielectric layer is a low k dielectric layer.

3. The method according to claim 1, wherein said first opening is a via opening.

4. The method according to claim 3, wherein said second opening is a trench opening.

5. The method according to claim 1, wherein said gap-filling material is selected from the group consisting of novolak, poly hydroxy styrene (PHS), acrylate, methacrylate, and cyclo alicylic co-polymer with maleic anhydride (COMA).

6. The method according to claim 1, wherein said step of palanrizing said gap-filling layer to expose said dielectric layer comprises chemical mechanical polishing said gap-filling layer.

7. The method according to claim 1, wherein said step of removing said portion of said gap-filling layer to said first depth comprises using said developer to remove said portion of said gap-filling layer.

8. The method according to claim 7, wherein said developer comprises a solution comprising tetramethylammonium hydroxide.

9. The method according to claim 1, wherein said step of forming said conductive layer comprises:

depositing a metal layer such that said metal layer is electrically continuous with said conductive structure; and planarizing said metal layer to expose said dielectric layer.

10. A method for forming a multi-level interconnect in an integrated circuit comprising a substrate having a conductive structure, a first dielectric layer on said substrate, an etch-stop layer on said first dielectric layer, and a second dielectric layer on said etch-stop layer, said method comprising:

forming a first patterned photoresist on said second dielectric layer, wherein said first patterned photoresist defines a via opening;

etching said second dielectric layer, said etch-stop layer and said first dielectric layer to exposed said conductive structure by using said first patterned photoresist as a mask;

removing said first patterned photoresist;

filling said via opening with a gap-filling material to form a gap-filling layer on said second dielectric layer, wherein said gap-filling material is dissolved in a developer;

planarizing said gap-filling layer to expose said second dielectric layer;

forming a bottom-anti-reflective coating layer on said second dielectric layer;

forming a second patterned photoresist on said bottom-anti-reflective coating layer, wherein said second patterned photoresist defines a trench opening;

etching said bottom-anti-reflective coating layer to expose said second dielectric layer by using said second patterned photoresist as a mask;

removing a portion of said gap-filling layer to a depth by using said developer;

etching said second dielectric layer to form said trench opening in said second dielectric layer;

removing said second patterned photoresist, said bottom-anti-reflective layer, and remaining said gap-filling layer; and filling said via opening and said trench opening with a conductive material to form a conductive layer.

11. The method according to claim 10, wherein said first dielectric layer is a low k dielectric layer.

12. The method according to claim 10, wherein said second dielectric layer is a low k dielectric layer.

13. The method according to claim 10, wherein said gap-filling material is selected from the group consisting of novolak, poly hydroxy styrene (PHS), acrylate, methacrylate, and cyclo alicylic co-polymer with maleic anhydride (COMA).

14. The method according to claim 10, wherein said step of planarizing said gap-filling layer comprises chemical mechanical polishing said gap-filling layer.

15. The method according to claim 10, wherein said depth is about reaching said etch-stop layer level.

16. The method according to claim 10, wherein said developer comprises a solution comprising tetramethylammonium hydroxide.

17. The method according to claim 10, wherein said step of forming said conductive layer comprises:

depositing a metal layer such that said metal layer is electrically continuous with said conductive structure; and planarizing said metal layer to expose said second dielectric layer.

18. A method for forming a dual damascene structure, said method comprising:

providing a substrate having a conductive structure;

forming a first low k dielectric layer on said substrate;

forming an etch-stop layer on said first low k dielectric layer;

forming a second low k dielectric layer on said etch-stop layer;

forming a first patterned photoresist on said second low k dielectric layer, wherein said first patterned photoresist defines a via opening;

etching said second low k dielectric layer, said etch-stop layer and said first low k dielectric layer to exposed said conductive structure by using said first patterned photoresist as a mask;

removing said first patterned photoresist;

filling said via opening with a novolak to form a novolak layer on said second low k dielectric layer;

planarizing said novolak layer to expose said second low k dielectric layer by chemical mechanical polishing;

forming a bottom-anti-reflective coating layer on said dielectric low k layer;

forming a second patterned photoresist on said bottom-anti-reflective coating layer, wherein said second patterned photoresist defines a trench opening;

etching said bottom-anti-reflective coating layer to expose said second low k dielectric layer by using said second patterned photoresist as a mask;

removing a portion of said novolak layer reaching about said etch-stop layer level by using a developer;

etching said second low k dielectric layer to form said trench opening in said second low k dielectric layer;

removing said second patterned photoresist, said bottom-anti-reflective layer, and remaining said novolak layer; and filling said via opening and said trench opening with a conductive material to form a conductive layer.

19. The method according to claim 18, wherein said developer is a solution comprising tetramethylammonium hydroxide.

20. The method according to claim 18, wherein said step of forming said conductive layer comprises:

depositing a metal layer such that said metal layer is electrically continuous with said conductive structure; and planarizing said metal layer to expose said second low k dielectric layer.

* * * * *